(12) United States Patent
Shchegrov et al.

(10) Patent No.: US 11,536,674 B2
(45) Date of Patent: Dec. 27, 2022

(54) SYSTEMS AND METHODS FOR COMBINED REFLECTOMETRY AND PHOTOELECTRON SPECTROSCOPY

(71) Applicant: KLA Corporation, Milpitas, CA (US)

(72) Inventors: Andrei V. Shchegrov, Campbell, CA (US); Alexander Kuznetsov, Austin, TX (US); Oleg Khodykin, Santa Cruz, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/079,243

(22) Filed: Oct. 23, 2020

(65) Prior Publication Data
US 2021/0055237 A1    Feb. 25, 2021

Related U.S. Application Data

(63) Continuation of application No. 16/230,489, filed on Dec. 21, 2018, now Pat. No. 10,895,541.
(Continued)

(51) Int. Cl.
*G01N 23/223* (2006.01)
*G01N 23/2273* (2018.01)
(Continued)

(52) U.S. Cl.
CPC ......... *G01N 23/223* (2013.01); *G01N 23/083* (2013.01); *G01N 23/2076* (2013.01);
(Continued)

(58) Field of Classification Search
None
See application file for complete search history.

(56) References Cited

U.S. PATENT DOCUMENTS

| 5,491,738 A | 2/1996 | Blake et al. |
| 5,608,526 A | 3/1997 | Piwonka-Corle et al. |

(Continued)

FOREIGN PATENT DOCUMENTS

WO    2016-154352 A1    9/2016

OTHER PUBLICATIONS

International Search Report dated Apr. 25, 2019, for PCT Application No. PCT/US2019/012235 filed on Jan. 4, 2019, by KLA-Tencor Corporation, 3 pages.
(Continued)

*Primary Examiner* — Edwin C Gunberg
(74) *Attorney, Agent, or Firm* — Spano Law Group; Joseph S. Spano

(57) ABSTRACT

Methods and systems for measuring structural and material characteristics of semiconductor structures based on combined x-ray reflectometry (XRR) and x-ray photoelectron spectroscopy (XPS) are presented herein. A combined XRR and XPS system includes an x-ray illumination source and x-ray illumination optics shared by both the XRR and XPS measurement subsystems. This increases throughput and measurement accuracy by simultaneously collecting XRR and XPS measurement data from the same area of the wafer. A combined XRR and XPS system improves measurement accuracy by employing XRR measurement data to improve measurements performed by the XPS subsystem, and vice-versa. In addition, a combined XRR and XPS system enables simultaneous analysis of both XRR and XPS measurement data to more accurately estimate values of one of more parameters of interest. In a further aspect, any of measurement spot size, photon flux, beam shape, beam diameter, and illumination energy are independently controlled.

21 Claims, 5 Drawing Sheets

Related U.S. Application Data

(60) Provisional application No. 62/614,399, filed on Jan. 6, 2018.

(51) Int. Cl.
*G01N 23/083* (2018.01)
*G01N 23/207* (2018.01)
*G02B 27/09* (2006.01)
*H05G 1/30* (2006.01)

(52) U.S. Cl.
CPC ..... *G01N 23/2273* (2013.01); *G02B 27/0977* (2013.01); *H05G 1/30* (2013.01)

(56) References Cited

U.S. PATENT DOCUMENTS

| | | | |
|---|---|---|---|
| 5,859,424 | A | 1/1999 | Norton et al. |
| 6,429,943 | B1 | 8/2002 | Opsal et al. |
| 6,816,570 | B2 | 11/2004 | Janik et al. |
| 7,358,494 | B1 | 4/2008 | Gao et al. |
| 7,478,019 | B2 | 1/2009 | Zangooie et al. |
| 7,769,726 | B2 | 9/2010 | Gendreau et al. |
| 7,929,667 | B1 | 4/2011 | Zhuang et al. |
| 7,933,026 | B2 | 4/2011 | Opsal et al. |
| 7,978,820 | B2 | 7/2011 | Kharchenko |
| 8,749,179 | B2 | 6/2014 | Liu et al. |
| 8,941,336 | B1 | 1/2015 | Liu et al. |
| 9,594,035 | B2 | 3/2017 | Pois et al. |
| 9,915,522 | B1 | 3/2018 | Jiang et al. |
| 10,012,606 | B1 * | 7/2018 | Bakeman ............. G01N 23/223 |
| 2006/0062350 | A1 | 3/2006 | Yokhim et al. |
| 2014/0019097 | A1 * | 1/2014 | Bakeman ............. G03F 7/70625 703/1 |
| 2014/0111791 | A1 | 4/2014 | Manassen et al. |
| 2014/0172394 | A1 | 6/2014 | Kuznetsov et al. |
| 2014/0222380 | A1 | 8/2014 | Kuznetsov et al. |
| 2014/0246607 | A1 | 9/2014 | Bykanov et al. |
| 2014/0306115 | A1 | 10/2014 | Kuritsyn et al. |
| 2014/0347666 | A1 | 11/2014 | Veldman et al. |
| 2015/0008335 | A1 | 1/2015 | Bykanov et al. |
| 2015/0032398 | A1 | 1/2015 | Peterlinz et al. |
| 2015/0076359 | A1 | 3/2015 | Bykanov et al. |
| 2015/0110249 | A1 | 4/2015 | Bakeman et al. |
| 2015/0117610 | A1 | 4/2015 | Veldman et al. |
| 2016/0128171 | A1 | 5/2016 | Kuritsyn et al. |
| 2016/0202193 | A1 | 7/2016 | Hench et al. |
| 2016/0249442 | A1 | 8/2016 | Kuritsyn et al. |
| 2016/0341674 | A1 * | 11/2016 | Wu .................. G01B 15/08 |
| 2017/0167862 | A1 | 6/2017 | Dziura et al. |
| 2017/0314912 | A1 | 11/2017 | Krishnan |
| 2017/0314913 | A1 | 11/2017 | Krishnan |
| 2018/0106735 | A1 | 4/2018 | Gellineau et al. |

OTHER PUBLICATIONS

Rubio-Zuazo, Juan and Castro, German R., Beyond hard x-ray photoelectron spectroscopy: Simultaneous combination with x-ray diffraction, Journal of Vacuum Science & Technology A: Vacuum, Surfaces, and Films 31, 031103 (2013).

Karslioglu, Osman et al., "Ambient-Pressure X-Ray Photoelectron Spectroscopy (APXPS)," Operando Research in Heterogeneous Catalysis, Springer Series in Chemical Physics, (Chemical, vol. 114 ), pp. 31-57.

Frenken, J. et al. (Eds), Operando Research in Heterogeneous Catalysis. Springer Series in Chemical Physics, vol. 114. Spinger, Cham); https://www.springer.com/us/book/9783319444376.

Lemaillet, Germer, Kline et al., "Intercomparison between optical and x-ray scatterometry measurements of FinFET structures" by Proc. SPIE, v.8681, p. 86810Q (2013).

Kline et al., "X-ray scattering critical dimensional metrology using a compact x-ray source for next generation semiconductor devices," J. Micro/Nanolith. MEMS MOEMS 16(1), 014001 (Jan.-Mar. 2017).

\* cited by examiner

SYSTEMS AND METHODS FOR COMBINED REFLECTOMETRY AND PHOTOELECTRON SPECTROSCOPY

CROSS REFERENCE TO RELATED APPLICATION

The present application is a continuation of, and claims priority under 35 U.S.C. § 120 from, U.S. patent application Ser. No. 16/230,489, entitled "Systems And Methods For Combined X-Ray Reflectometry And Photoelectron Spectroscopy," filed Dec. 21, 2018, which, in turn, for patent claims priority under 35 U.S.C. § 119 from U.S. provisional patent application Ser. No. 62/614,399, filed Jan. 6, 2018, the subject matter of which is incorporated herein by reference in its entirety.

TECHNICAL FIELD

The described embodiments relate to x-ray metrology systems and methods, and more particularly to methods and systems for improved measurement accuracy.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. A number of metrology based techniques including scatterometry and reflectometry implementations and associated analysis algorithms are commonly used to characterize critical dimensions, film thicknesses, composition and other parameters of nanoscale structures.

Traditionally, optical scatterometry critical dimension measurements are performed on targets consisting of thin films and/or repeated periodic structures. During device fabrication, these films and periodic structures typically represent the actual device geometry and material structure or an intermediate design. As devices (e.g., logic and memory devices) move toward smaller nanometer-scale dimensions, characterization becomes more difficult. Devices incorporating complex three-dimensional geometry and materials with diverse physical properties contribute to characterization difficulty.

Accurate information concerning the material composition and shape of nanostructures is limited in the process development environment of a leading-edge, front-end semiconductor fabrication facility. Optical scatterometry based metrology systems rely on accurate geometric and dispersion models to avoid measurement bias. With limited knowledge of material composition and shape of nanostructures available apriori, measurement recipe development and validation is a slow and tedious process. For example, cross-sectional transmission electron microscopy (TEM) images are used to guide optical scatterometry model development, but TEM imaging is slow and destructive.

Scatterometric optical metrology tools utilizing infrared to visible light measure zero-order diffraction signals from sub-wavelength structures. As device critical dimensions continue to shrink scatterometric optical metrology sensitivity and capability is decreasing. Furthermore, when absorbing materials are present in the structure under measurement, penetration and scattering of illumination light in the optical region (e.g., 0.5-10 ev) limits the utility of conventional optical metrology systems.

Similarly, electron beam based metrology systems struggle to penetrate semiconductor structures due to absorption and scattering of the illuminating, backscattered, and secondary emission electrons.

Atomic force microscopes (AFM) and scanning-tunneling microscopes (STM) are able to achieve atomic resolution, but they can only probe the surface of the specimen. In addition, AFM and STM microscopes require long scanning times that make these technologies impractical in a high volume manufacturing (HVM) setting.

Scanning electron microscopes (SEM) achieve intermediate resolution levels, but are unable to penetrate structures to sufficient depth. Thus, high-aspect ratio holes are not characterized well. In addition, the required charging of the specimen has an adverse effect on imaging performance.

Transmission, Small-Angle X-Ray Scatterometry (T-SAXS) systems employing photons at a hard X-ray energy level (>15 keV) have shown promise to address challenging measurement applications. However, scattering of hard x-rays from shallow structures, e.g., logic metrology applications, is weak, which severely limits achievable measurement resolution and throughput. As such, T-SAXS has not been shown to be a viable option for logic metrology applications in an HVM environment.

X-ray reflectometer (XRR) measurement systems offer an opportunity to reduce some limitations of optical scatterometry based metrology systems by utilizing x-ray illumination, rather than optical illumination. XRR measurement systems are typically employed to estimate geometrical parameters of interest. However, XRR systems rely on accurate material information to avoid measurement bias. With limited knowledge of material composition of nanostructures available apriori, measurement accuracy is limited.

X-Ray photoelectron spectroscopy (XPS) systems are generally employed to measure chemical properties of materials, such as chemical composition. However, XPS measurements of chemical properties of materials comprising thin films or grating structures correlate to material geometry. Since, material geometry is not accurately known, apriori, the resulting chemical composition measurements suffer from poor accuracy.

In summary, there is a need for a dimensional metrology system having measurement capability for low aspect ratio structures and an illumination beam spot size compatible with scribe-line targets. In one example, there is a need to develop and validate measurement recipes for the metrology system and operate the metrology system in a high volume manufacturing (HVM) environment without substantial prior dimensional and material composition information.

SUMMARY

Methods and systems for measuring structural and material characteristics of semiconductor structures with a combined x-ray reflectometry (XRR) and x-ray photoelectron spectroscopy (XPS) measurement system are presented.

In one aspect, a combined XRR and XPS system includes an x-ray illumination source and x-ray illumination optics shared by both the XRR and XPS measurement subsystems. A combined XRR and XPS system increases throughput and measurement accuracy by illuminating the same area of the wafer and collecting XRR and XPS measurement data simultaneously.

In general, a combined XRR and XPS system improves measurement accuracy by employing XRR measurement data to improve measurements performed by the XPS subsystem, and vice-versa. In some embodiments, a combined XRR and XPS system illuminates the same target simultaneously. In addition, a combined XRR and XPS system enables simultaneous analysis of both XRR and XPS measurement data to more accurately estimate values of one of more parameters of interest. Simultaneous XRR and XPS measurements of a metrology target by a combined XRR and XPS system increases measurement throughput compared to separate measurements of the metrology target by separate XRR and XPS systems. Furthermore, simultaneous XRR and XPS measurements of a metrology target by a combined XRR and XPS system avoid target positioning errors that occur when separate measurements of the metrology target are performed by separate XRR and XPS systems.

In some embodiments, the XRR measurement subsystem is configured as a grazing incidence, small angle x-ray scatterometry (GI-SAXS) system operating near the critical angles for reflection for semiconductor materials. In some other embodiments, the XRR measurement subsystem is configured as a reflective, small-angle x-ray scatterometer (RSAXS). In some embodiments, the RSAXS measurements are performed with x-ray radiation in the soft x-ray (SXR) region (i.e., 80-3000 eV) at grazing angles of incidence in the range of 5-20 degrees. These relatively large grazing angles enable deeper penetration into structures under measurement and smaller measurement spot size (e.g., less than 50 micrometers). In some embodiments, RSAXS measurements of a semiconductor wafer are performed over a range of wavelengths, angles of incidence, and azimuth angles with a small beam spot size.

In one aspect, the source area of the x-ray illumination source is characterized by a lateral dimension of less than 20 micrometers. In some embodiments, the source area is characterized by a lateral dimension of 10 micrometers or less. Small source size enables illumination of a small target area on the specimen with high brightness, thus improving measurement precision, accuracy, and throughput.

In a further aspect, the x-ray illumination source is tunable over a wide range of x-ray photon energies to control x-ray penetration depth for XRR measurements and control photoelectron volume generation for XPS measurements.

In a further aspect, one or more x-ray optical elements are located in the illumination path to independently control measurement spot size, photon flux, beam shape, beam diameter, illumination energy, or any combination thereof, for each measurement. Similarly, in some embodiments, one or more x-ray optical elements are located in the collection path to independently control measurement spot size, photon flux, beam shape, beam diameter, energy of collected photons, or any combination thereof, for each measurement. In some embodiments, one or more beam blocking elements are located in the collection path to block one or several diffraction orders. In some embodiments, an electron blocking element is located in the collection path to prevent electrons from reaching the x-ray detector.

In another further aspect, the XPS subsystem of the combined XRR and XPS metrology system is maintained in a low vacuum environment (e.g., less than 100 millibars), rather than a high vacuum environment.

In yet another aspect, the precision and accuracy of parameters measured with either or both XRR and XPS techniques is improved by identifying shared model parameters that are mathematically resolved using data sets derived from XRR and XPS measurements either sequentially or in parallel.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Figure 1:
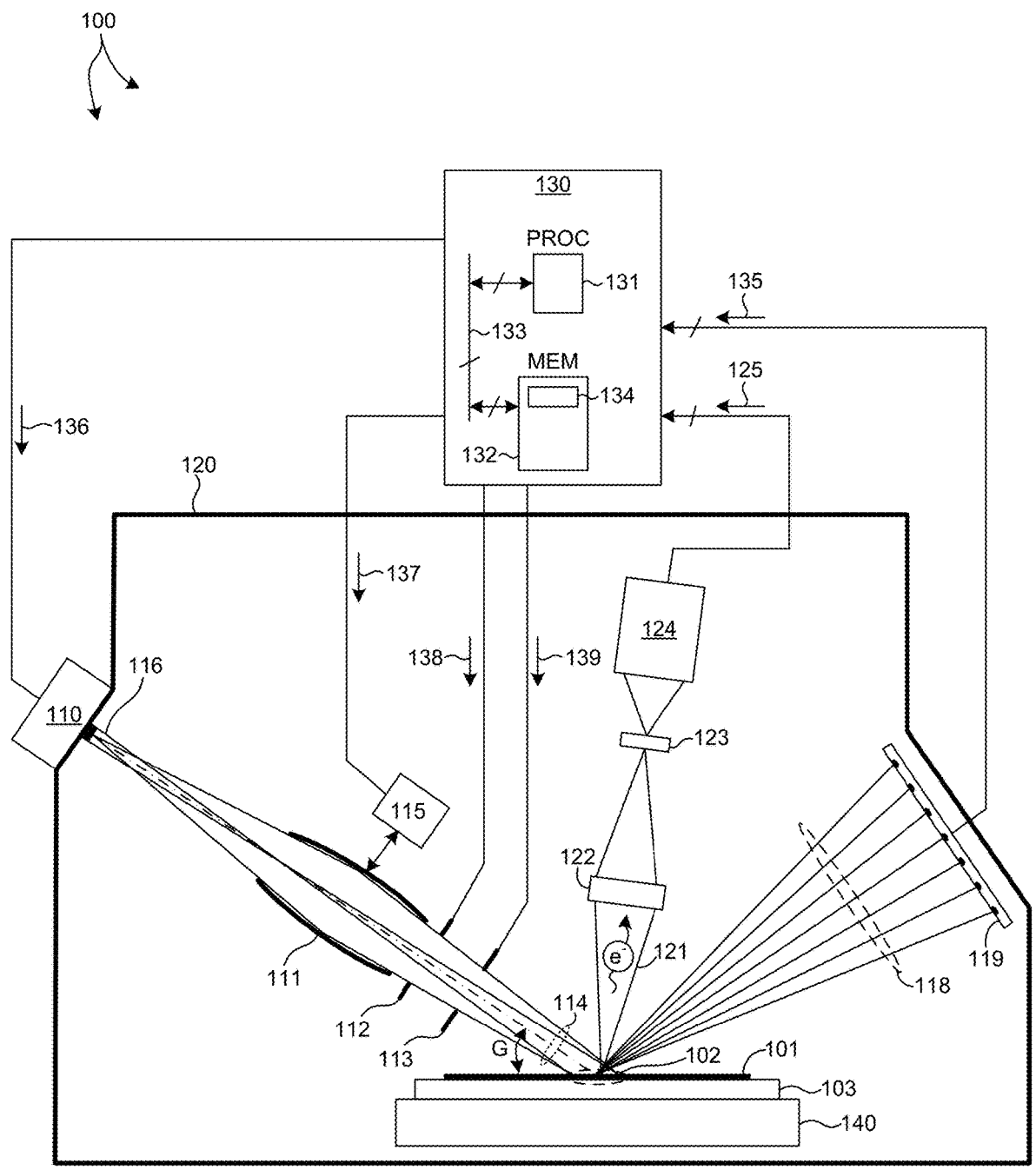
FIG. 1 is a simplified diagram illustrative of an embodiment of a combined x-ray reflectometry (XRR) and x-ray photoelectron spectroscopy (XPS) metrology tool 100 for measuring characteristics of a specimen in at least one novel aspect.

Reference will now be made in detail to background examples and some embodiments of the invention, examples of which are illustrated in the accompanying drawings.

Methods and systems for measuring structural and material characteristics (e.g., material composition, dimensional characteristics of structures and films, etc.) of semiconductor structures associated with different semiconductor fabrication processes with a combined x-ray reflectometry (XRR) and x-ray photoelectron spectroscopy (XPS) measurement system are presented.

In one aspect, a combined XRR and XPS system includes an X-ray illumination source and X-ray illumination optics shared by both the XRR and XPS measurement subsystems. Sharing a common X-ray illumination source and X-ray illumination optics reduces system complexity, cost, and machine footprint in a fabrication facility. In addition, a combined XRR and XPS system increases throughput and measurement accuracy by illuminating the same area of the wafer and collecting XRR and XPS measurement data simultaneously.

In general, a combined XRR and XPS system improves measurement accuracy by employing XRR measurement data to improve measurements performed by the XPS subsystem, and vice-versa. In addition, a combined XRR and XPS system enables simultaneous analysis of both XRR and XPS measurement data to more accurately estimate values of one of more parameters of interest. Simultaneous XRR and XPS measurements of a metrology target by a combined XRR and XPS system increases measurement throughput compared to separate measurements of the metrology target by separate XRR and XPS systems. Furthermore, simultaneous XRR and XPS measurements of a metrology target by a combined XRR and XPS system avoid target positioning errors that occur when separate measurements of the metrology target are performed by separate XRR and XPS systems.

In general, the XRR measurement subsystem of a combined XRR and XPS metrology system is any suitable x-ray based metrology tool that illuminates and collects x-ray photons and photoelectrons from the same side of the specimen (e.g., a semiconductor wafer). The collected x-ray photons are scattered, diffracted, refracted, specularly reflected, or any combination thereof, from the specimen in response to the x-ray illumination.

In some embodiments, the XRR measurement subsystem is configured as a grazing incidence, small angle x-ray scatterometry (GI-SAXS) system operating near the critical angles for reflection for semiconductor materials (e.g., grazing angle of less than one degree) and photon energies above 8 keV to maximize diffracted intensity. The surface sensitivity of GI-SAXS measurements is excellent, but penetration of high aspect ratio structures is very limited due to evanescent field behavior. In addition, the illumination beam spot size projected onto the wafer is typically large (e.g., greater than 1 mm). Thus, typically, large, specialized metrology targets are required to perform GI-SAXS measurements.

In some other embodiments, the XRR measurement subsystem is configured as a reflective, small-angle x-ray scatterometer (RSAXS). In some embodiments, the RSAXS measurements are performed with x-ray radiation in the soft x-ray (SXR) region (i.e., 80-3000 eV) at grazing angles of incidence in the range of 5-20 degrees. These relatively large grazing angles enable deeper penetration into structures under measurement and smaller measurement spot size (e.g., less than 50 micrometers). Grazing angles for a particular measurement application are selected to achieve a desired penetration into the structure under measurement and maximize measurement information content with a small beam spot size. In some embodiments, RSAXS measurements of a semiconductor wafer are performed over a range of wavelengths, angles of incidence, and azimuth angles with a small beam spot size (e.g., less than 50 micrometers across the effective illumination spot).

FIG. 1 illustrates an embodiment of a combined XRR and XPS metrology system 100 for measuring characteristics of a specimen in at least one novel aspect. As shown in FIG. 1, metrology system 100 may be used to perform both XRR and XPS measurements over a measurement area 102 of a specimen 101 illuminated by an incident x-ray illumination beam spot. As depicted in FIG. 1, x-ray illumination beam 114 is emitted by X-ray illumination source 110 and projected onto specimen 101. X-ray photons reflected, diffracted, scattered, in response to incident x-ray illumination beam 114 are collected and detected by x-ray detector 119. Simultaneously, photo-emitted electrons 121, induced by x-ray illumination beam 114 are collected by electron detector 124. Output signals 135 indicative of the x-ray photons detected by x-ray detector 119 and output signals 125 indicative of the photo-emitted electrons detected by electron detector 124 are communicated to computing system 130. Computing system 130 estimates values of one or more geometric parameters of interest, material parameters of interest, or both, based on the output signals 125 and 135.

As illustrated in the embodiment depicted in FIG. 1, metrology system 100 includes an x-ray illumination source 110 and illumination optics that provide x-ray illumination to semiconductor wafer 101 over measurement area 102. X-ray illumination source 110 is configured to generate X-ray radiation suitable for both XRR and XPS measurements.

In some embodiments, X-ray illumination source 110 is a monochromatic source. In some embodiments, an x-ray source includes a tunable monochromator that enables the x-ray source to deliver x-ray radiation at different, selectable wavelengths. In some embodiments, one or more x-ray sources are employed to ensure that the x-ray source supplies light at wavelengths that allow sufficient penetration into the specimen under measurement.

In some embodiments, X-ray illumination source 110 is a high-brightness, polychromatic x-ray illumination source. In some embodiments, the x-ray illumination source 110 is configured to generate x-ray radiation in a range between 80-3000 electron-volts. In general, any suitable high-brightness x-ray illumination source capable of generating high brightness soft x-rays (SXR) at flux levels sufficient to enable high-throughput, inline metrology may be contemplated to supply x-ray illumination for XRR measurements.

In some embodiments, illumination source 110 is a laser produced plasma (LPP) light source. In some of these embodiments the LPP light source includes any of Xenon, Krypton, Argon, Neon, and Nitrogen emitting materials. In general, the selection of a suitable LPP target material is optimized for brightness in resonant SXR regions. For example, plasma emitted by Krypton provides high brightness at the Silicon K-edge. In another example, plasma emitted by Xenon provides high brightness throughout the entire SXR region of (80-3000 eV). As such, Xenon is a good choice of emitting material when broadband SXR illumination is desired.

LPP target material selection may also be optimized for reliable and long lifetime light source operation. Noble gas target materials such as Xenon, Krypton, and Argon are inert and can be reused in a closed loop operation with minimum or no decontamination processing. An exemplary SXR illumination source is described in U.S. patent application Ser. No. 15/867,633, the content of which is incorporated herein by reference in its entirety.

In some embodiments, illumination source 110 is a high harmonic generation (HHG) x-ray source. In some other embodiments, illumination source 110 is a wiggler/undulator synchrotron radiation source (SRS). An exemplary wiggler/undulator SRS is described in U.S. Pat. Nos. 8,941,336 and 8,749,179, the contents of which are incorporated herein by reference in their entireties.

In some embodiments, x-ray illumination source 110 includes an electron beam source configured to bombard solid or liquid targets to stimulate x-ray radiation. Methods and systems for generating high brightness, liquid metal x-ray illumination are described in U.S. Pat. No. 7,929,667, issued on Apr. 19, 2011, to KLA-Tencor Corp., the entirety of which is incorporated herein by reference.

In general x-ray illumination source 110 may include a particle accelerator source, a liquid anode source, a rotating anode source, a stationary, solid anode source, a microfocus source, a microfocus rotating anode source, a plasma based source, an inverse Compton source, or any combination thereof. Additional description of suitable x-ray illumination sources is found in U.S. Patent Publication No. 2016/0249442, U.S. Patent Publication No. 2016/0128171, U.S. Patent Publication No. 2015/0076359, U.S. Patent Publication No. 2015/0008335, U.S. Patent Publication No. 2014/0306115, and U.S. Patent Publication No. 2014/0246607, and U.S. Provisional Patent Application No. 62/039,772, the contents of which are incorporated herein by reference in their entireties.

X-ray illumination source 110 produces x-ray emission over a source area having finite lateral dimensions (i.e., non-zero dimensions orthogonal to the beam axis. In one aspect, the source area of illumination source 110 is characterized by a lateral dimension of less than 20 micrometers. In some embodiments, the source area is characterized by a lateral dimension of 10 micrometers or less. Small source size enables illumination of a small target area on the specimen with high brightness, thus improving measurement precision, accuracy, and throughput.

In a further aspect, x-ray illumination source 110 is tunable over a wide range of x-ray photon energies. Furthermore, the beam energy (i.e., wavelength(s)) of the x-ray illumination provided by illumination source 110 is controlled to achieve a desired x-ray penetration depth for XRR measurements and control of photoelectron volume generation for XPS measurements. In this manner, illumination source 110 is controlled to increase detection capability for a structure of interest. In some examples, x-ray illumination source 110 is controlled to illuminate a metrology target with photons in a specified energy range that induces photoemission from some materials of the metrology target, but not others.

In some embodiments, illumination source 110 is a LPP light source controlled by computing system 130 to maximize flux in one or more selected spectral regions. Laser peak intensity at the target material controls the plasma temperature and thus the spectral region of emitted radiation. Laser peak intensity is varied by adjusting pulse energy, pulse width, or both. In one example, a 100 picosecond pulse width is suitable for generating SXR radiation. As depicted in FIG. 1, computing system 130 communicates command signals 136 to illumination source 110 that cause illumination source 110 to adjust the spectral range of wavelengths emitted from illumination source 110. In one example, illumination source 110 is a LPP light source, and the LPP light source adjusts any of a pulse duration, pulse frequency, and target material composition to realize a desired spectral range of wavelengths emitted from the LPP light source.

In general, x-ray illumination optics shape and direct x-ray radiation from x-ray illumination source 110 to specimen 101. In a further aspect, one or more x-ray optical elements are located in the illumination path to independently control measurement spot size, photon flux, beam shape, beam diameter, illumination energy, or any combination thereof, for each measurement.

In some embodiments, one or more focusing x-ray optics are located in the illumination path to control measurement spot size. In some embodiments, one or more collimating x-ray optics are located in the illumination path to control measurement spot size.

In some embodiments, one or more monochromatic x-ray optical elements are located in the illumination path. In some embodiments, one or more polychromatic x-ray optical elements are located in the illumination path. In some embodiments, one or more x-ray optical elements are located in the illumination path to control illumination energy, for example, by filtering out undesired illumination energies.

In preferred embodiments, a broadband x-ray illumination source is employed in combination with reflective, multi-layer x-ray optical elements located in the illumination path to control penetration into specimen 101.

In some embodiments, one or more slits located in the illumination path control beam shape incident on specimen 101. In some examples, the x-ray optics collimate or focus the x-ray beam onto measurement area 102 of specimen 101 to less than 1 milliradian divergence using multilayer x-ray optics.

In some embodiments, the x-ray optics include one or more x-ray collimating mirrors, x-ray apertures, x-ray beam stops, refractive x-ray optics, diffractive optics such as zone plates, Schwarzschild optics, Kirkpatrick-Baez optics, Montel optics, Wolter optics, specular x-ray optics such as ellipsoidal mirrors, polycapillary optics such as hollow capillary x-ray waveguides, multilayer optics or systems, or any combination thereof. Further details are described in U.S. Patent Publication No. 2015/0110249, the content of which is incorporated herein by reference it its entirety.

In the depicted embodiment, metrology system 100 includes an x-ray illumination source 110, focusing optics 111, beam divergence control slit 112, and slit 113. As depicted in FIG. 1, focusing optics 111 focuses source radiation onto a metrology target located on specimen 101. The finite lateral source dimension results in finite spot size 102 on the target defined by the rays 116 coming from the edges of the source and any beam shaping provided by beam slits 112 and 113.

In some embodiments, focusing optics 111 includes elliptically shaped focusing optical elements. In the embodiment depicted in FIG. 1, the magnification of focusing optics 111 at the center of the ellipse is approximately one. As a result, the illumination spot size projected onto the surface of specimen 101 is approximately the same size as the illumination source, adjusted for beam spread due to the nominal grazing incidence angle (e.g., 5-20 degrees).

In a further aspect, focusing optics 111 collect source emission and select one or more discrete wavelengths or spectral bands, and focus the selected light onto specimen 101 at grazing angles of incidence in the range 5-20 degrees.

The nominal grazing incidence angle, G, is selected to achieve a desired penetration of the metrology target to maximize signal information content while remaining within metrology target boundaries. The critical angle of hard x-rays is very small, but the critical angle of soft x-rays is significantly larger. As a result of this additional measurement flexibility RSAXS measurements probe more deeply into the structure with less sensitivity to the precise value of the grazing incidence angle.

In some embodiments, focusing optics 111 include graded multi-layers that select desired wavelengths or ranges of wavelengths for projection onto specimen 101. In some examples, focusing optics 111 includes a graded multi-layer structure (e.g., layers or coatings) that selects one wavelength and projects the selected wavelength onto specimen 101 over a range of angles of incidence. In some examples, focusing optics 111 includes a graded multi-layer structure that selects a range of wavelengths and projects the selected wavelengths onto specimen 101 over one angle of incidence. In some examples, focusing optics 111 includes a graded multi-layer structure that selects a range of wavelengths and projects the selected wavelengths onto specimen 101 over a range of angles of incidence.

Graded multi-layered optics are preferred to minimize loss of light that occurs when single layer grating structures are too deep. In general, multi-layer optics select reflected wavelengths. The spectral bandwidth of the selected wavelengths optimizes flux provided to specimen 101, information content in the measured diffracted orders, and prevents degradation of signal through angular dispersion and diffraction peak overlap at the detector. In addition, graded multi-layer optics are employed to control divergence. Angular divergence at each wavelength is optimized for flux and minimal spatial overlap at the detector.

In some examples, graded multi-layer optics select wavelengths to enhance contrast and information content of diffraction signals from specific material interfaces or structural dimensions. For example, the selected wavelengths may be chosen to span element-specific resonance regions (e.g., Silicon K-edge, Nitrogen, Oxygen K-edge, etc.). In addition, in these examples, the illumination source may also be tuned to maximize flux in the selected spectral region (e.g., HHG spectral tuning, LPP laser tuning, etc.)

In some other examples, little to no prior structural information is available at the time of measurement. In these examples, multiple wavelengths (e.g., 3-4) are selected to enable measurement of diffraction patterns across the absorption edge. The measured signals enable model-free measurement of structural properties with no prior information except the elemental composition of the structures under measurement using, for example, multiple wavelength anomalous diffraction techniques. After estimating structural properties based on model-free measurements, parameter estimates may be further refined using model-based measurement techniques.

In some examples, the anomalous scattering factors (i.e., scattering properties) of the metrology target under measurement are not known apriori. In these examples, film multilayer reflectivity is measured at multiple resonant wavelengths. Angular excursions of Bragg peaks provide sufficient information to extract the anomalous scattering factors.

In some embodiments, focusing optics 111 include a plurality of reflective optical elements each having an elliptical surface shape. Each reflective optical element includes a substrate and a multi-layer coating tuned to reflect a different wavelength or range of wavelengths. In some embodiments, a plurality of reflective optical elements (e.g., 1-5) each reflecting a different wavelength or range of wavelengths are arranged at each angle of incidence. In a further embodiment, multiple sets (e.g., 2-5) of reflective optical elements each reflecting a different wavelength or range of wavelengths are arranged at a different angle of incidence. In some embodiments, the multiple sets of reflective optical elements simultaneously project illumination light onto specimen 101 during measurement. In some other embodiments, the multiple sets of reflective optical elements sequentially project illumination light onto specimen 101 during measurement. In these embodiments, active shutters or apertures are employed to control the illumination light projected onto specimen 101.

Figure 2:
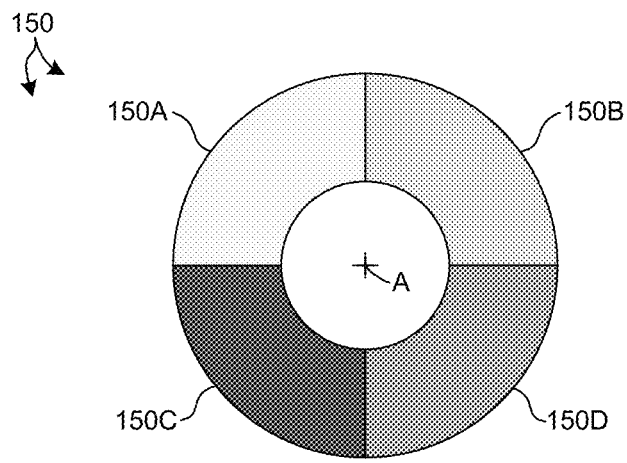
FIG. 2 is a simplified diagram illustrative of an end view of focusing optics including four mirror elements disposed around the beam axis, A, in a segmented toroidal configuration.

In some embodiments, focusing optics 111 focus light at multiple wavelengths, azimuths and AOI on the same metrology target area. FIG. 2 depicts an end view (i.e., along the beam axis) of focusing optics 150 including four mirror elements 150A-150D disposed around the beam axis, A, in a segmented toroidal configuration. Each mirror element includes a multi-layer coating tuned to reflect a different wavelength or range of wavelengths. In some embodiments, each mirror element 150A-D includes a uniform multilayer design (i.e., the surface of a particular mirror element reflects the same wavelength or range of wavelengths over the entire mirror surface area of that particular mirror element). In some other embodiments, each mirror element includes a non-uniform multilayer design (i.e., the wavelength or range of wavelengths reflected by the mirror element depends on the location of incidence on the mirror surface). In some of these embodiments, each mirror element is elliptical in shape and projects illumination light to specimen 101 over a range of angles of incidence. In addition, because the mirror elements are arranged in a toroidal configuration, the mirror elements project illumination light to specimen 101 over a range of azimuth angles. Although, FIG. 2 depicts four mirror elements, in general, focusing optics may include any number of mirror elements arranged to focus light at multiple wavelengths, azimuths and AOI on the same metrology target area. In some other embodiments, focusing optics includes a number of mirror elements nested in the plane of incidence (i.e., a nested Wolter configuration).

In a further aspect, the ranges of wavelengths, AOI, Azimuth, or any combination thereof, projected onto the same metrology area, are adjusted by actively positioning one or more mirror elements of the focusing optics. As depicted in FIG. 1, computing system 130 communicates command signals to actuator system 115 that causes actuator system 115 to adjust the position, alignment, or both, of one or more of the optical elements of focusing optics 111 to achieve the desired ranges of wavelengths, AOI, Azimuth, or any combination thereof, projected onto specimen 101.

In general, the angle of incidence is selected for each wavelength to optimize penetration and absorption of the illumination light by the metrology target under measurement. In many examples, multiple layer structures are measured and angle of incidence is selected to maximize signal information associated with the desired layers of interest. In the example of overlay metrology, the wavelength(s) and angle(s) of incidence are selected to maximize signal information resulting from interference between scattering from the previous layer and the current layer. In addition, azimuth angle is also selected to optimize signal information content. In addition, azimuth angle is selected to ensure angular separation of diffraction peaks at the detector.

In a further aspect, a combined XRR and XPS metrology system (e.g., metrology system 100) includes one or more beam slits or apertures to shape the illumination beam 114 incident on specimen 101 and selectively block a portion of illumination light that would otherwise illuminate a metrology target under measurement. One or more beam slits define the beam size and shape such that the x-ray illumination spot fits within the area of the metrology target under measurement. In addition, one or more beam slits define illumination beam divergence to minimize overlap of diffraction orders on the detector.

In another further aspect, a combined XRR and XPS metrology system (e.g., metrology system 100) includes one or more beam slits or apertures to select a set of illumination wavelengths that simultaneously illuminate a metrology target under measurement. In some embodiments, illumination including multiple wavelengths is simultaneously incident on a metrology target under measurement. In these embodiments, one or more slits are configured to pass illumination including multiple illumination wavelengths. In general, simultaneous illumination of a metrology target under measurement is preferred to increase signal information and throughput. However, in practice, overlap of diffraction orders at the detector limits the range of illumination wavelengths. In some embodiments, one or more slits are configured to sequentially pass different illumination wavelengths. In some examples, sequential illumination at larger angular divergence provides higher throughput because the signal to noise ratio for sequential illumination may be higher compared to simultaneous illumination when beam divergence is larger. When measurements are performed sequentially the problem of overlap of diffraction orders is not an issue. This increases measurement flexibility and improves signal to noise ratio.

FIG. 1 depicts a beam divergence control slit 112 located in the beam path between focusing optics 111 and beam shaping slit 113. Beam divergence control slit 112 limits the divergence of the illumination provided to the specimen under measurement. Beam shaping slit 113 is located in the beam path between beam divergence control slit 112 and specimen 101. Beam shaping slit 113 further shapes the incident beam 114 and selects the illumination wavelength(s) of incident beam 114. Beam shaping slit 113 is located in the beam path immediately before specimen 101. In one aspect, the slits of beam shaping slit 113 are located in close proximity to specimen 101 to minimize the enlargement of the incident beam spot size due to beam divergence defined by finite source size.

In some embodiments, beam shaping slit 113 includes multiple, independently actuated beam shaping slits. In one embodiment, beam shaping slit 113 includes four independently actuated beam shaping slits. These four beams shaping slits effectively block a portion of the incoming beam and generate an illumination beam 114 having a box shaped illumination cross-section.

Slits of beam shaping slit 113 are constructed from materials that minimize scattering and effectively block incident radiation. Exemplary materials include single crystal materials such as Germanium, Gallium Arsenide, Indium Phosphide, etc. Typically, the slit material is cleaved along a crystallographic direction, rather than sawn, to minimize scattering across structural boundaries. In addition, the slit is oriented with respect to the incoming beam such that the interaction between the incoming radiation and the internal structure of the slit material produces a minimum amount of scattering. The crystals are attached to each slit holder made of high density material (e.g., tungsten) for complete blocking of the x-ray beam on one side of the slit.

In general, x-ray collection optics collect, shape, and direct x-ray radiation from specimen 101 to x-ray detector 119. In a further aspect, one or more x-ray optical elements are located in the collection path to independently control measurement spot size, photon flux, beam shape, beam diameter, energy of collected photons, or any combination thereof, for each measurement. In general, the x-ray collection path may include any combination of elements described hereinbefore with reference to the illumination path.

In some embodiments, one or more beam blocking elements are located in the collection path to block one or several diffraction orders. In some embodiments, a beam blocking element is employed to block 0th order reflection. Exemplary beam blocking elements include slits, metallic beam stops, etc.

In some embodiments, an electron blocking element is located in the collection path to prevent electrons from reaching x-ray detector 119 or other x-ray optical elements in the x-ray collection path. An electron beam blocking element is transparent or semi-transparent to x-ray photons to minimize disruption to collected x-ray photons. In some embodiments, the electron blocking element is integrated with x-ray detector 119.

X-ray detector 119 collects x-ray radiation 118 from specimen 101 in response to incident illumination beam 114 and generates an output signals 135 indicative of properties of specimen 101 that are sensitive to the incident x-ray radiation in accordance with a XRR measurement modality. In some embodiments, scattered x-rays 118 are collected by x-ray detector 119 while specimen positioning system 140 locates and orients specimen 101 to produce angularly resolved scattered x-rays.

In some embodiments, combined XRR and XPS metrology system 100 includes one or more photon counting detectors with high dynamic range (e.g., greater than $10^5$). In some embodiments, a single photon counting detector detects the position and number of detected photons.

In some embodiments, the x-ray detector resolves one or more x-ray photon energies and produces signals for each x-ray energy component indicative of properties of the specimen. In some embodiments, the x-ray detector 119 includes any of a CCD array, a microchannel plate, a photodiode array, a microstrip proportional counter, a gas filled proportional counter, a scintillator, or a fluorescent material.

In this manner the X-ray photon interactions within the detector are discriminated by energy in addition to pixel location and number of counts. In some embodiments, the X-ray photon interactions are discriminated by comparing the energy of the X-ray photon interaction with a predetermined upper threshold value and a predetermined lower threshold value. In one embodiment, this information is communicated to computing system 130 via output signals 135 for further processing and storage.

Diffraction patterns resulting from simultaneous illumination of a periodic target with multiple illumination wavelengths are separated at the detector plane due to angular dispersion in diffraction. In these embodiments, integrating detectors are employed. The diffraction patterns are measured using area detectors, e.g., vacuum-compatible backside CCD or hybrid pixel array detectors. Angular sampling is optimized for Bragg peak integration. If pixel level model fitting is employed, angular sampling is optimized for signal information content. Sampling rates are selected to prevent saturation of zero order signals.

In general, electron collection optics collect, shape, and direct photo-emitted electrons from specimen 101 to electron detector 124 along an electron collection path. In some embodiments, the electron collection path includes one or more electron optical elements that control the electron beam.

In some embodiments, one or more magnetic field shielding elements are located at or near the electron collection path to minimize disturbances due to external magnetic fields to the flow of electrons from specimen 101 to electron detector 124.

In some embodiments, one or more electron analyzers are located in the electron beam path to sort the photo-emitted electrons according to energy. In some of these embodiments, the one or more electron analyzers filter out electrons with undesired electron energies. In some embodiments, the one or more electron analyzers a Cylindrical Mirror Analyzer (CMA), a Cylindrical Sector Analyzer (CSA), a Hemispherical Sector Analyzer (HSA), a Retarding Field Analyzer (RFA), or a combination thereof.

In the embodiment depicted in FIG. 1, photo-emitted electrons 121 are collected by electron collection optics 122 and focused onto analyzer 123. In one example, analyzer 123 is a hemispherical analyzer that includes a magnetic and electrostatic field along a single axis. This disperses the electrons with respect to energy along one axis, and does not disperse the electrons with respect to energy along the other axis. The resulting field of electrons is detected by detector 124 while specimen positioning system 140 locates and orients specimen 101. By way of non-limiting example, detector 124 may be a solid state detector, a microchannel plate, or a phosphor coupled to a charge coupled device (CCD). In some examples detector 124 is a two dimensional detector employed in conjunction with a hemispherical analyzer as described hereinbefore. In these embodiments, detector 124 is able to resolve one or more electron energies along one axis and produce signals for each electron energy component indicative of properties of the specimen. In addition, the two dimensional detector is able to resolve the spatial distribution of the collected electron field along the other axis. The resulting spatial distribution is also indicative of properties of the specimen.

In this manner, detector 124 collects photoelectrons 121 emitted from specimen 101 and generates an output signal 125 indicative of properties of specimen 101 that are sensitive to the incident photoelectrons in accordance with a XPS measurement modality.

In general, any suitable electron detector may be employed to detect photo-emitted electrons from specimen 101. In some embodiments, electron detector 124 simultaneously measures the kinetic energy and number of electrons that escape from specimen 101. By way of non-limiting example, electron detector 124 may include an electron multiplier, a channeltron, a channel plate, etc. In some embodiments, electron detector 124 is a high-resolution detector enabling acquisition of high-resolution XPS signals.

In some embodiments, electron detector 124 is located in the x-ray measurement plane formed by the beam of x-ray illumination light 114 and x-ray collection light 118. In some other embodiments, electron detector 124 is located outside the x-ray measurement plane.

In some examples, it is desirable to perform combined XRR and XPS measurements at large ranges of wavelength, angle of incidence and azimuth angle to increase the precision and accuracy of measured parameter values. This approach reduces correlations among parameters by extending the number and diversity of data sets available for analysis.

XRR measurements of the intensity of diffracted radiation as a function of illumination wavelength and x-ray incidence angle relative to the wafer surface normal are collected. Information contained in the multiple diffraction orders is typically unique between each model parameter under consideration. Thus, x-ray scattering yields estimation results for values of parameters of interest with small errors and reduced parameter correlation.

In addition, angle-resolved XPS measurements enable data collection for angle-resolved photoemission spectroscopy (ARPES). Angle-resolved XPS signals extract additional information from the XPS system and expand the space of parameters of interest that may be resolve by XPS measurements. In one example, XPS measurements of material properties as a function of depth are achieved by tilting the sample. In some embodiments, wafer stage 140 capable of large tilt angles is employed to position specimen 101 for angle resolved XPS measurements. In some embodiments, electron detector 124 and associated electron collection optics are configured to be selectively positioned with respect to specimen 101 at different angles for angle resolved XPS measurements. In some of these embodiments, x-ray source 110 and associated illumination optics are also configured to be selectively positioned with respect to specimen 101 to enable angle resolve XPS measurements at different incidence angles. In some embodiments, multiple electron detectors 124, each located at different angles with respect to specimen 101 are employed to enable angle resolved XPS measurements.

Figure 3:
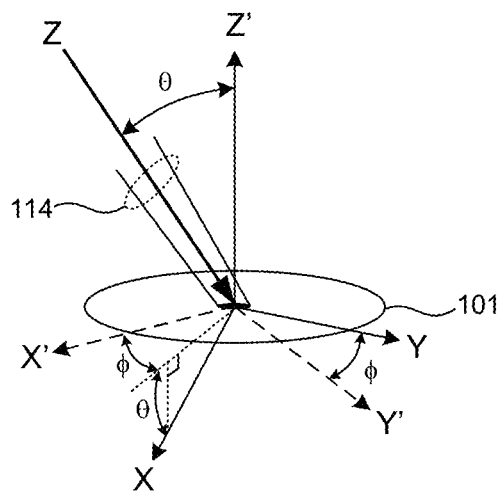
FIG. 3 depicts x-ray illumination beam incident on a wafer at a particular orientation described by an angle of incidence, $\theta$, and an azimuth angle, $\phi$.

Each orientation of the illuminating x-ray beam 114 relative to the surface normal of a semiconductor wafer 101 is described by any two angular rotations of wafer 101 with respect to the x-ray illumination beam 114, or vice-versa. In one example, the orientation can be described with respect to a coordinate system fixed to the wafer. FIG. 3 depicts x-ray illumination beam 114 incident on wafer 101 at a particular orientation described by an angle of incidence, $\theta$, and an azimuth angle, $\phi$. Coordinate frame XYZ is fixed to the metrology system (e.g., illumination beam 116) and coordinate frame X'Y'Z' is fixed to wafer 101. The Y axis is aligned in plane with the surface of wafer 101. X and Z are not aligned with the surface of wafer 101. Z' is aligned with an axis normal to the surface of wafer 101, and X' and Y' are in a plane aligned with the surface of wafer 101. As depicted in FIG. 3, x-ray illumination beam 114 is aligned with the Z-axis and thus lies within the XZ plane. Angle of incidence, $\theta$, describes the orientation of the x-ray illumination beam 114 with respect to the surface normal of the wafer in the XZ plane. Furthermore, azimuth angle, $\phi$, describes the orientation of the XZ plane with respect to the X'Z' plane. Together, $\theta$ and $\phi$, uniquely define the orientation of the x-ray illumination beam 114 with respect to the surface of wafer 101. In this example, the orientation of the x-ray illumination beam with respect to the surface of wafer 101 is described by a rotation about an axis normal to the surface of wafer 101 (i.e., Z' axis) and a rotation about an axis aligned with the surface of wafer 101 (i.e., Y axis). In some other examples, the orientation of the x-ray illumination beam with respect to the surface of wafer 101 is described by a rotation about a first axis aligned with the surface of wafer 101 and another axis aligned with the surface of wafer 101 and perpendicular to the first axis.

In one aspect, metrology tool 100 includes a wafer chuck 103 that fixedly supports wafer 101 and is coupled to specimen positioning system 140. Specimen positioning system 140 configured to actively position specimen 101 in six degrees of freedom with respect to illumination beam 114. In one example, computing system 130 communicates command signals (not shown) to specimen positioning system 140 that indicate the desired position of specimen 101. In response, specimen positioning system 140 generates command signals to the various actuators of specimen positioning system 140 to achieve the desired positioning of specimen 101.

In a further aspect, the focusing optics of an RSAXS system projects an image of the illumination source onto the specimen under measurement with a demagnification of at least five (i.e., magnification factor of 0.2 or less). In some embodiments, the focusing optics of an RSAXS system projects an image of the illumination source onto the specimen under measurement with a demagnification of at least two (i.e., magnification factor of 0.5 or less). An RSAXS system as described herein employs a SXR illumination source having a source area characterized by a lateral dimension of 20 micrometers or less (i.e., source size is 20 micrometers or smaller). In some embodiments, focusing optics are employed with a demagnification factor of at least five (i.e., project an image of the source onto the wafer that is five times smaller than the source size) to project illumination onto a specimen with an incident illumination spot size of four micrometers or less.

Figure 4:
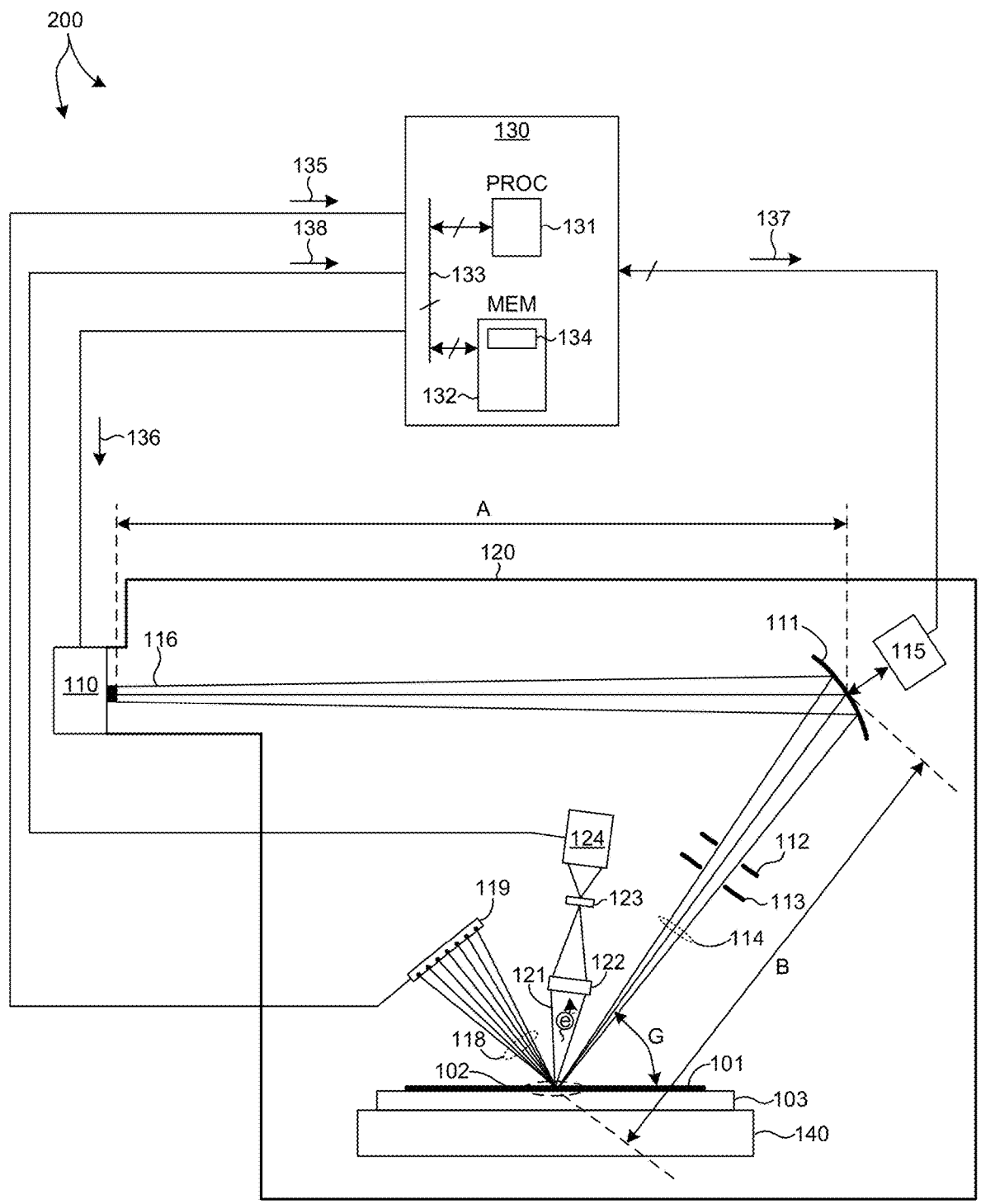
FIG. 4 is a simplified diagram illustrative of another embodiment of a combined x-ray reflectometry (XRR) and x-ray photoelectron spectroscopy (XPS) metrology tool 200 for measuring characteristics of a specimen in at least one novel aspect.

FIG. 4 illustrates an embodiment of a RSAXS metrology tool 200 in another embodiment. As illustrated in FIG. 4, the system 200 may be used to perform RSAXS measurements over a measurement area 102 having dimensions less than 1-2 micrometers. Like numbered elements depicted in FIG. 4 are analogous to those described with reference to FIG. 1. As depicted in FIG. 4, focusing optics 111 are elliptical optical elements. However, focusing optics 111 are arranged with respect to illumination source 110 and specimen 101 such that the distance, A, between illumination source 110 and focusing optics 111 is significantly greater than the distance, B, between focusing optics 111 and specimen 101. In some embodiments, the ratio of A/B is at least five. In some embodiments, the ratio of A/B is at least ten. This results in a demagnification of the illumination source onto specimen 101 by a factor of A/B. In one embodiment, the size of illumination source 110 is approximately 10 micrometers and focusing optics 111 are arranged such that A/B is ten. In this embodiment, the illumination spot size projected onto specimen 101 is approximately 1 micrometer.

In some embodiments, illumination source 110 is an LPP light source having a source size of 10 micrometers, or less, and focusing optics 111 have a demagnification factor of approximately 10. This enables RSAXS metrology tool 200 to focus illumination light onto a metrology target having dimensions of 1-2 micrometers. By focusing incident illumination light to an illumination spot size of 1-2 micrometers, RSAXS metrology tool 200 enables the measurement of critical dimension targets and overlay targets located in-die, rather than relying on larger metrology targets located in the wafer scribe line areas.

The ability to measure targets having dimensions of 1-2 micrometers reduces the wafer area committed to specialized metrology targets. In addition, the ability to measure targets having dimensions of 1-2 micrometers enables the direct measurement of device structures, rather than specialized metrology targets. Measuring device structures directly eliminates target-to-device bias. This significantly improves measurement quality. In addition, measurements of in-die targets enable characterization of parameter variation within-die. Exemplary parameters of interest include critical dimensions, overlay, and edge placement errors.

In another further aspect, the XPS subsystem of the combined XRR and XPS metrology system is maintained in a low vacuum environment (e.g., less than 100 millibars), rather than a high vacuum environment. Typical stand-alone XPS metrology systems are maintained in a high vacuum environment (e.g., approximately $10^{-8}$ millibar or lower pressure) or an ultra-high vacuum environment (e.g., approximately $10^{-8}$ millibar or lower pressure). Integration of an XPS subsystem at such a high vacuum level is complex and not cost effective.

Exemplary XPS systems operating at ambient or near-ambient pressures are described by Karslioğlu O., Bluhm H. (2017) Ambient-Pressure X-ray Photoelectron Spectroscopy (APXPS). In: Frenken J., Groot I. (eds) Operando Research in Heterogeneous Catalysis. Springer Series in Chemical Physics, vol 114. Springer, Cham. Springer, Cham, the content of which is incorporated herein by reference in its entirety.

As depicted in FIGS. 1 and 4, elements of the XRR and XPS subsystems of the combined XRR and XPS metrology systems 100 and 200 are maintained in a low vacuum environment within vacuum chamber 120.

Each of the XRR and XPS measurement modules described hereinbefore is capable of performing stand-alone measurements and analysis. In some examples, XRR and XPS measurements are performed sequentially or simultaneously to characterize the same or different material or structural properties of a specimen based on decoupled XRR and XPS analyses.

In some examples, a RSAXS subsystem is employed to determine properties of a specimen (e.g., structural parameter values) based on one or more diffraction orders of scattered light. As depicted in FIG. 1, metrology tool 100 includes a computing system 130 employed to acquire signals 135 generated by detector 119 and determine properties of the specimen based at least in part on the acquired signals. Signal information measured by an XRR subsystem, such as the RSAXS subsystem depicted in FIG. 1, may be used to estimate values of geometric parameters of interest (e.g., layer thicknesses, grating heights, critical dimensions, side wall angles, overlay, etch placement error, etc.), material parameters of interest (e.g., material composition), or both.

In some examples, metrology based on RSAXS involves determining the dimensions of the sample by the inverse solution of a pre-determined measurement model with the measured data. The measurement model includes a few (on the order of ten) adjustable parameters and is representative of the geometry and optical properties of the specimen and the optical properties of the measurement system. The method of inverse solve includes, but is not limited to, model based regression, tomography, machine learning, or any combination thereof. In this manner, target profile parameters are estimated by solving for values of a parameterized measurement model that minimize errors between the measured scattered x-ray intensities and modeled results.

In some examples, a XPS subsystem is employed to determine properties of a specimen based on x-ray photoemission signals indicating the number of electrons detected at each electron energy level. As depicted in FIG. 1, metrology tool 100 includes a computing system 130 employed to acquire signals 125 generated by detector 124 and determine properties of the specimen based at least in part on the acquired signals. In some examples, computing system 130 employs peak-fitting to extract features of acquired signals 125. In these examples, peak-fitting involves estimation of peak positions, including shifts, intensity peaks, etc. Peaks may be estimated at full width, half maximum amplitude, peak amplitude, etc. In some examples peak-fitting involves modeling of experimental settings, instrument design factors, sample variables, etc.

In some examples, signal information measured by an XPS subsystem may be used to estimate values of material parameters of interest indicative of surface chemistry, (e.g., chemical elements, including surface contaminates, their binding energies and atomic percentages, chemical or electronic states of each element, material electron density and density of electronic states, crystallinity, elemental doping, etc.). In some examples, specimen 101 is probed to a depth of approximately 10 nanometers, or less. However, in general, the exact depth depends on X-ray penetration depth, electron escape rates, surface profile, material composition, and other factors. Hence, in some examples, it is possible to extract XPS signal information from depths that exceed 10 nanometers, for example, from structures having three dimensional profiles (e.g., periodic gratings).

In some examples, signal information measured by an XPS subsystem may be used to estimate values of geometric parameters of interest (e.g., one or more layer thicknesses, grating heights, trench depth, hole depth, etc.) based on depth-resolved XPS measurement data. In these examples, XPS measurements are performed at different x-ray beam energies, incidence angles, etc., to generate depth-resolved XPS measurement data.

In some examples, signal information measured by an XPS subsystem at different locations on a specimen are employed to estimate values of parameters of interest indicative of specimen uniformity.

In yet another aspect, the precision and accuracy of parameters measured with either or both XRR and XPS techniques is improved by identifying shared model parameters that are mathematically resolved using data sets derived from XRR and XPS measurements either sequentially or in parallel. Measuring shared parameters with a diversity of measurement technologies reduces correlations among parameters and improves measurement accuracy.

The combined fitting of XRR metrology data and XPS metrology data is advantageous for any type of XRR and XPS technology that provides complementary sensitivity to geometric and/or material parameters of interest. This is specifically the case where at least one geometric (e.g., film thickness) or material parameter is common between the XRR and the XPS models. Specimen parameters can be deterministic (e.g., film thicknesses, composition, stoichiometry, CD, SWA, grating height, etc.) as long as proper models describing XRR and XPS beam interaction with the specimen are used.

Measurement accuracy may be enhanced by any combination of feed sideways analysis, feed forward analysis, and parallel analysis. Feed sideways analysis refers to taking multiple data sets on different areas of the same specimen and passing common parameters determined from the first dataset onto the second dataset for analysis. Feed forward analysis refers to taking data sets on different specimens and passing common parameters forward to subsequent analyses using a stepwise copy exact parameter feed forward approach. Parallel analysis refers to the parallel or concurrent application of a non-linear fitting methodology to multiple datasets where at least one common parameter is coupled during the fitting.

Multiple tool and structure analysis refers to a feed forward, feed sideways, or parallel analysis based on regression, a look-up table (i.e., "library" matching), or another fitting procedure of multiple datasets. Exemplary methods and systems for multiple tool and structure analysis is described in U.S. Pat. No. 7,478,019, issued on Jan. 13, 2009, to KLA-Tencor Corp., the entirety of which is incorporated herein by reference.

The combined use of XRR and XPS enables measurement of structures and materials at a variety of depths. High flux, high energy x-ray radiation penetrates into opaque areas of the target that enables characterization of buried structures, high aspect ratio structures, and devices including many thin film layers. Examples of characteristics measured using combined XRR and XPS as described herein include but are not limited to film thickness, elemental composition, and stoichiometry.

In some examples, material composition and electron density determined by XPS is employed to improve accuracy of XRR measurements which heavily rely on these the values of these parameters.

In some examples, dimensional information extracted from XRR is employed to improve accuracy of XPS composition measurements. In one example, a specimen includes a silicon oxynitride (SiON) film layer on top of a silicon substrate. In this example, precise SiON layer thickness measurements based on XRR are incorporated into the XPS measurement model to improve the accuracy of XPS composition measurements.

Examples of structures measured using combined XRR and XPS as described herein include but are not limited to photoresist and other patterning materials in double-patterning or multiple-patterning processes, FinFETs, low-dimensional structures such as nanowires or graphene, sub 10 nm structures, thin films, lithographic structures, through substrate vias (TSVs), memory structures such as DRAM, DRAM 4F2, FLASH and high aspect ratio memory structures. In some examples, combined XRR and XPS enable the measurement of features smaller than 10 nm as well as advanced semiconductor structures such as spin-transfer-torque MRAM where measurements of geometrical parameters and material parameters are needed.

The combined use of XRR and XPS enables measurement of in-die targets, actual device targets, or proxy targets having larger dimensions.

In yet another aspect, acquired measurement signals from XPS and XRR subsystems are simultaneously processed by computing system 130 in a combined analysis to improve estimated values of material composition and geometric parameters of interest.

In a further aspect, computing system 130 is configured to generate a structural model (e.g., geometric model, material model, or combined geometric and material model) of a measured structure of a specimen, generate an XRR response model and a XPS response model that each include at least one shared geometric or material parameter from the structural model, and resolve at least one specimen parameter value by performing a fitting analysis on XRR measurement data with the XRR response model and a fitting analysis on XPS measurement data with the XPS response model. In the embodiment depicted in FIG. 1, computing system 130 is configured as a model building and analysis engine configured to implement model building and analysis functionality as described herein.

Figure 5:
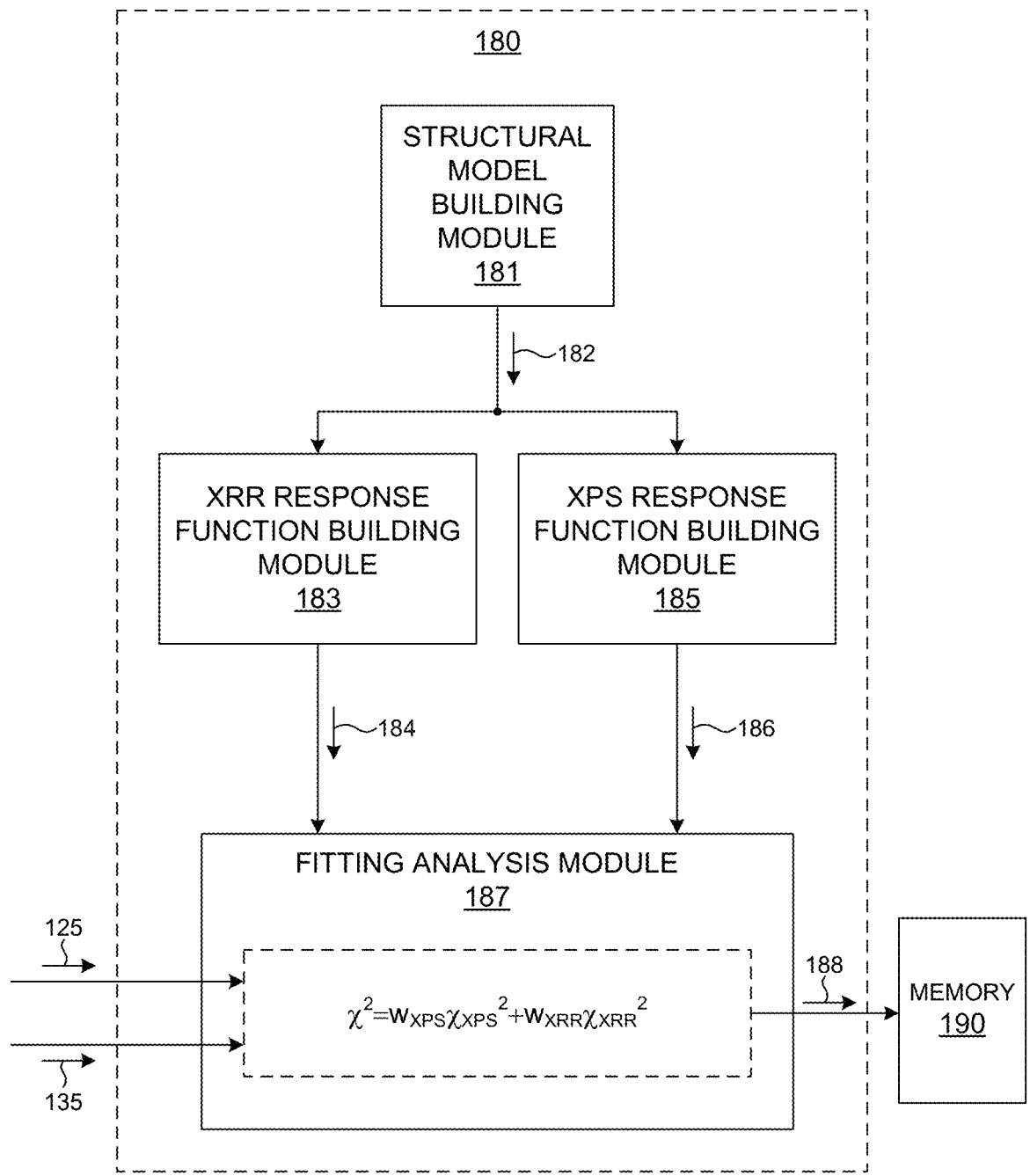
FIG. 5 is a simplified diagram illustrative of an exemplary model building and analysis engine.

FIG. 5 is a diagram illustrative of an exemplary model building and analysis engine 180 implemented by computing system 130. As depicted in FIG. 5, model building and analysis engine 180 includes a structural model building module 181 that generates a structural model 182 of a measured structure of a specimen. In some embodiments, structural model 182 includes both geometric and material properties of the specimen. The structural model 182 is received as input to XRR response function building module 183 and XPS response function building module 185. XRR response function building module 183 generates a XRR response function model 184 based at least in part on the structural model 182. In some examples, the XRR response function model 184 is based on x-ray form factors $$F(\vec{q}) = \int \rho(\vec{r}) e^{-i\vec{q}\cdot\vec{r}} d\vec{r} \qquad (1)$$

where F is the form factor, q is the scattering vector, and $\rho(r)$ is the electron density of the specimen in spherical coordinates. The x-ray scattering intensity is then given by $$I(\vec{q}) = F^*F. \qquad (2)$$

Similarly, XPS response function building module 185 generates an XPS response function model 186 based at least in part on the structural model 182.

XRR response function model 184 and XPS response function model 186 are received as input to fitting analysis module 187. The fitting analysis module 187 compares the modeled XRR and XPS response data with the corresponding measured data to determine geometric as well as material properties of the specimen.

In some examples, the fitting of modeled data to experimental data is achieved by minimizing a chi-squared value. For example, for XPS metrology, a chi-squared value can be defined as $$\chi_{XPS}^2 = \frac{1}{N_{XPS}} \sum_i^{N_{XPS}} \frac{\left(S_i^{XPS-model}(u_1, \ldots, u_M) - S_i^{XPS-experiment}\right)^2}{\sigma_{XPS,i}^2} \quad (3)$$

where $S_i^{XPS-experiment}$ is the measured XPS signals 125 measured experimentally in the "channel" i, where the index i describes a set of system parameters such as wavelength, angular coordinate, etc. $S_i^{XPS-model}(u_1, \ldots, u_M)$ is the modeled XPS signal for the "channel" i, evaluated for a set of structure (target) parameters where these parameters describe geometric and material features of the measured structure. $\sigma_{XPS,i}$ is the uncertainty associated with "channel" i. $N_{XPS}$ is the total number of channels in the XPS metrology. M is the number of parameters characterizing the metrology target.

Similarly, for XRR measurements, a chi-squared value can be defined as $$\chi_{XRR}^2 = \frac{1}{N_{XRR}} \sum_i^{N_{XPS}} \frac{\left(S_j^{XRR-model}(v_1, \ldots, v_L) - S_j^{XRR-experiment}\right)^2}{\sigma_{XRR,j}^2} \quad (4)$$

Where, $S_j^{XRR-experiment}$ is the measured XRR signals 135 in the "channel" j, where the index j describes a set of system parameters such as energy, angular coordinate, etc. $S_j^{XRR-model}(v_1, \ldots, v_L)$ is the modeled XRR signal $S_j$ for the "channel" j, evaluated for a set of structure (target) parameters $v_1, \ldots, v_L$, where these parameters describe geometric (film thicknesses, CD, sidewall angle, overlay, etc.) and material (electron density, etc.). $\sigma_{XRR,j}$ is the uncertainty associated with the $j^{th}$ channel. $N_{XRR}$ is the total number of channels in the XRR metrology. L is the number of parameters characterizing the structure under measurement.

Equations (3) and (4) assume that the uncertainties associated with different channels are uncorrelated. In examples where the uncertainties associated with the different channels are correlated, a covariance between the uncertainties, can be calculated. In these examples a chi-squared value for XPS measurements can be expressed as $$\chi_{XPS}^2 = \frac{1}{N_{XPS}} \left(\vec{S}_i^{XPS-model}(u_1, \ldots, u_M) - \vec{S}_i^{XPS-experiment}\right)^T \quad (5)$$
$$V_{XPS}^{-1}\left(\vec{S}_i^{XPS-model}(u_1, \ldots, u_M) - \vec{S}_i^{XPS-experiment}\right)$$

where, $V_{XPS}$ is the covariance matrix of the XPS channel uncertainties, and T denotes the transpose. A chi-squared value for XRR measurements can be calculated in the same manner.

The set of target parameters for the XPS model (i.e., $\{u_1, \ldots, u_M\}$) and the XRR model (i.e., $\{v_1, \ldots, v_L\}$) are not the same in general. The reason is that the difference in material constants and functions needed to describe XPS and XRR interaction processes give rise to different target parameters. However, at least one geometric parameter is common between the XRR response function model 184 and the XPS response function model 186. The common parameter is either identical or related to each other by an unambiguous algebraic transformation. In some examples, target parameters such as film thicknesses, material composition, etc., are common between both the XRR response function model 184 and the XPS response function model 186.

In some examples, fitting analysis module 187 resolves at least one specimen parameter value by sequentially performing a fitting analysis on XRR measurement data 135 with the XRR response model 184 and a fitting analysis on XPS measurement data 125 with the XPS response model 186. In some examples, $\chi_{XPS}^2$ is optimized first, and any resolved, common specimen parameter values are treated as constants in the subsequent optimization of $\chi_{XRR}^2$. Similarly, in some other examples, $\chi_{XRR}^2$ is optimized first, and any resolved, common specimen parameter values are treated as constants in the subsequent optimization of $\chi_{XPS}^2$.

In some other examples, fitting analysis module 157 resolves at least one specimen parameter value by performing a parallel fitting analysis on XRR measurement data 135 with the XRR response model 184 and on XPS measurement data 125 with the XPS response model 186. For example, a chi-squared function suitable for parallel analysis can be defined as $$\chi^2 = w_{XPS}\chi_{XPS}^2 + w_{XRR}\chi_{XRR}^2 \quad (6)$$

where $w_{XPS}$ and $w_{XRR}$ are weighting coefficients that are assigned to the XPS and XRR metrologies. In the simplest case, $w_{XPS} = w_{XRR} = 1$. However; assigning different weights often enhances the more relevant metrology. The selection of proper weights is usually done by analysis of experimental data versus reference metrology and/or measuring pre-programmed design of experiments (DOE) parameter variations on special DOE targets.

As described hereinbefore, the fitting of XRR and XPS data is achieved the minimization of chi-squared values. However, in general, the fitting of XRR and XPS data may be achieved by other functions.

The combined fitting of XPS metrology data and XRR metrology data is advantageous for any type of XRR and XPS technology that provides complementary sensitivity to geometric and/or material parameters of interest. This is specifically the case where at least one structural parameter is common between the XRR and the XPS models. Specimen parameters can be deterministic (e.g., film thicknesses, CD, SWA, etc.) or statistical (e.g., rms height of sidewall roughness, roughness correlation length, etc.) as long as proper models describing XRR and XPS beam interaction with the specimen are used.

In another further aspect, an initial estimate of values of one or more parameters of interest is determined based on combined XRR and XPS measurements performed at a single orientation of the incident x-ray beam with respect to the measurement target. The initial, estimated values are implemented as the starting values of the parameters of interest for a regression of the measurement models with measurement data collected from combined XRR and XPS measurements at multiple orientations. In this manner, a close estimate of a parameter of interest is determined with a relatively small amount of computational effort, and by implementing this close estimate as the starting point for a regression over a much larger data set, a refined estimate of the parameter of interest is obtained with less overall computational effort.

In another aspect, metrology systems 100 and 200 include a computing system (e.g., computing system 130) configured to implement beam control functionality as described herein. In the embodiment depicted in FIG. 1, computing system 130 is configured as a beam controller operable to control any of the illumination properties such as intensity, divergence, spot size, polarization, spectrum, and positioning of the incident illumination beam 114.

As illustrated in FIG. 1, computing system 130 is communicatively coupled to detector 119. Computing system 130 is configured to receive measurement data 135 from detector 119. In one example, measurement data 135 includes an indication of the measured response of the specimen (i.e., intensities of the diffraction orders). Based on the distribution of the measured response on the surface of detector 119, the location and area of incidence of illumination beam 114 on specimen 101 is determined by computing system 130. In one example, pattern recognition techniques are applied by computing system 130 to determine the location and area of incidence of illumination beam 114 on specimen 101 based on measurement data 135. In some examples, computing system 130 communicates command signals 136 to x-ray illumination source 110 to select the desired illumination wavelength. In some examples, computing system 130 communicates command signals 137 to actuator subsystem 115 to redirect the x-ray emission to achieve a desired beam direction. In some examples, computing system 130 communicates command signals 138 and 139 to beam shaping slits 112 and 113, respectively, that cause beam shaping slits 112 and 113 to change the beam spot size and select illumination wavelengths such that incident illumination beam 114 arrives at specimen 101 with the desired beam spot size, orientation, and wavelength(s). In one example, command signals 138 and 139 cause actuators associated with slits 112 and 113 to change position to reshape the incident beam 114 to a desired shape and size and select desired wavelengths. In some other examples, computing system 130 communicates a command signal to wafer positioning system 140 to position and orient specimen 101 such that incident illumination beam 114 arrives at the desired location and angular orientation with respect to specimen 101.

In general, combined XRR and XPS measurements may be performed on a semiconductor wafer at any step of a semiconductor fabrication process, including blank wafer, wafer with films, wafer with patterned structures, etc. In some examples, the patterned structures fabricated on a semiconductor wafer under measurement include trenches, holes, or other voids. Accuracy of combined XRR and XPS measurements of structures with significant voids is typically enhanced due to deeper penetration of X-rays and improved escape rate of photon-emitted electrons, which results in improved signal to noise for electron detection. This is particularly advantageous when soft x-ray illumination is employed.

In some embodiments, measurements combined XRR and XPS measurements are performed on a semiconductor wafer having a patterned structure filled with a liquid or gaseous material to enhance contrast between measured materials and improve measurement accuracy. Additional description of measurements of filled structures is provided in U.S. Patent Publication No. 2017/0314913 and U.S. Patent Publication No. 2017/0314912.

It should be recognized that the various steps described throughout the present disclosure may be carried out by a single computer system 130 or, alternatively, a multiple computer system 130. Moreover, different subsystems of the systems 100 and 200, such as the specimen positioning system 140, may include a computer system suitable for carrying out at least a portion of the steps described herein. Therefore, the aforementioned description should not be interpreted as a limitation on the present invention but merely an illustration. Further, the one or more computing systems 130 may be configured to perform any other step(s) of any of the method embodiments described herein.

In addition, the computer system 130 may be communicatively coupled to the x-ray illumination source 110, beam shaping slits 112 and 113, focusing optics actuator system 115, specimen positioning system 140, detector 119, and electron detector 124 in any manner known in the art. For example, the one or more computing systems 130 may be coupled to computing systems associated with the x-ray illumination source 110, beam shaping slits 112 and 113, focusing optics actuator system 115, specimen positioning system 140, and detector 119, respectively. In another example, any of the x-ray illumination source 110, beam shaping slits 112 and 113, focusing optics actuator system 115, specimen positioning system 140, detector 119, and electron detector 124 may be controlled directly by a single computer system coupled to computer system 130.

The computer system 130 may be configured to receive and/or acquire data or information from the subsystems of the system (e.g., x-ray illumination source 110, beam shaping slits 112 and 113, focusing optics actuator system 115, specimen positioning system 140, detector 119, electron detector 124, and the like) by a transmission medium that may include wireline and/or wireless portions. In this manner, the transmission medium may serve as a data link between the computer system 130 and other subsystems of the systems 100 and 200.

Computer system 130 of the metrology systems 100 and 200 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 130 and other systems (e.g., memory on-board metrology systems 100 and 200, external memory 190, or external systems). For example, the computing system 130 may be configured to receive measurement data (e.g., signals 125 and 135) from a storage medium (i.e., memory 132 or 190) via a data link. For instance, measurement data obtained using detectors 119 and 124 may be stored in a permanent or semi-permanent memory device (e.g., memory 132 or 190). In this regard, the measurement results may be imported from on-board memory or from an external memory system. Moreover, the computer system 130 may send data to other systems via a transmission medium. For instance, specimen parameter values 188 determined by computer system 130 may be stored in a permanent or semi-permanent memory device (e.g., memory 190). In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

Figure 6:
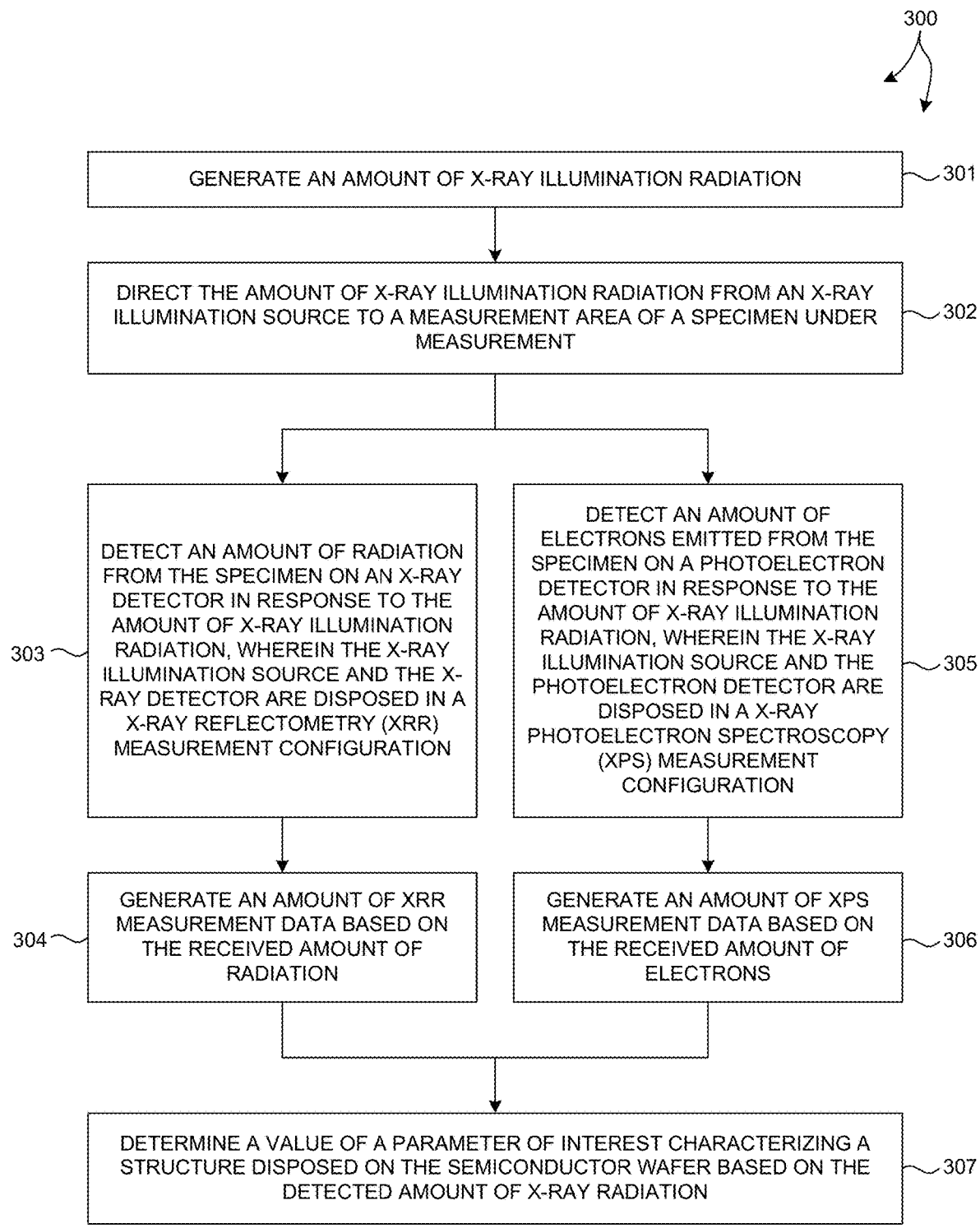
FIG. 6 is a flowchart of a method of performing combined XRR and XPS measurements of a semiconductor wafer in accordance with the methods described herein.

FIG. 6 illustrates a method 300 suitable for implementation by the metrology systems 100 and 200 of the present invention. In one aspect, it is recognized that data processing blocks of method 300 may be carried out via a pre-programmed algorithm executed by one or more processors of computing system 130. While the following description is presented in the context of metrology systems 100 and 200, it is recognized herein that the particular structural aspects of metrology systems 100 and 200 do not represent limitations and should be interpreted as illustrative only.

In block 301, an amount of x-ray illumination radiation is generated by an x-ray illumination source.

In block 302, the amount of x-ray illumination radiation is directed from the x-ray illumination source to a measurement area of a specimen under measurement.

In block 303, an amount of radiation from the specimen is detected on an x-ray detector in response to the amount of x-ray illumination radiation. The x-ray illumination source and the x-ray detector are disposed in an X-Ray Reflectometry (XRR) measurement configuration.

In block 304, an amount of XRR measurement data is generated based on the received amount of radiation.

In block 305, an amount of electrons emitted from the specimen is detected on a photoelectron detector in response to the amount of x-ray illumination radiation. The x-ray illumination source and the photoelectron detector are disposed in a X-Ray Photoelectron Spectroscopy (XPS) measurement configuration.

In block 306, an amount of XPS measurement data is generated based on the received amount of electrons.

In block 307, a value of a parameter of interest characterizing a structure disposed on the specimen within the measurement area is estimated based on the XRR measurement data and the XPS measurement data.

In some embodiments, combined XRR and XPS measurements as described herein are implemented as part of a fabrication process tool. Examples of fabrication process tools include, but are not limited to, lithographic exposure tools, film deposition tools, implant tools, and etch tools. In this manner, the results of a combined XRR and XPS analysis are used to control a fabrication process. In one example, combined XRR and XPS measurement data collected from one or more targets is sent to a fabrication process tool. The combined XRR and XPS measurement data is analyzed as described herein and the results used to adjust the operation of the fabrication process tool to reduce errors in the manufacture of semiconductor structures.

Combined XRR and XPS measurements as described herein may be used to determine characteristics of a variety of semiconductor structures. Exemplary structures include, but are not limited to, FinFETs, low-dimensional structures such as nanowires or graphene, sub 10 nm structures, lithographic structures, through substrate vias (TSVs), memory structures such as DRAM, DRAM 4F2, FLASH, MRAM and high aspect ratio memory structures. Exemplary structural characteristics include, but are not limited to, geometric parameters such as line edge roughness, line width roughness, pore size, pore density, side wall angle, profile, critical dimension, pitch, thickness, overlay, and material parameters such as electron density, composition, grain structure, morphology, stress, strain, and elemental identification. In some embodiments, the metrology target is a periodic structure. In some other embodiments, the metrology target is aperiodic.

In some examples, measurements of critical dimensions, thicknesses, overlay, and material properties of high aspect ratio semiconductor structures including, but not limited to, spin transfer torque random access memory (STT-RAM), three dimensional NAND memory (3D-NAND) or vertical NAND memory (V-NAND), dynamic random access memory (DRAM), three dimensional FLASH memory (3D-FLASH), resistive random access memory (Re-RAM), and phase change random access memory (PC-RAM) are performed with RSAXS measurement systems as described herein.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including critical dimension applications and overlay metrology applications. However, such terms of art do not limit the scope of the term "metrology system" as described herein. In addition, the metrology systems described herein may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the measurement techniques described herein.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, XRF disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A metrology system comprising:
   an x-ray illumination source configured to generate an amount of x-ray illumination radiation;
   one or more x-ray illumination optical elements disposed in an illumination path between the x-ray illumination source and a specimen under measurement, wherein the one or more x-ray illumination optical elements direct the amount of x-ray illumination radiation from the x-ray illumination source to a measurement area of the specimen under measurement;
   an x-ray detector configured to receive an amount of radiation from the specimen in response to the amount of x-ray illumination radiation, wherein the x-ray illumination source and the x-ray detector are disposed in a X-Ray Reflectometry (XRR) measurement configuration, and wherein the x-ray detector generates an amount of XRR measurement data based on the received amount of radiation; and
   a photoelectron detector configured to receive an amount of electrons emitted from the specimen in response to the amount of x-ray illumination radiation, wherein the x-ray illumination source and the photoelectron detector are disposed in a X-Ray Photoelectron Spectroscopy (XPS) measurement configuration, and wherein the photoelectron detector generates an amount of XPS measurement data based on the received amount of electrons; and
   a computing system configured to estimate a value of a parameter of interest characterizing a structure disposed on the specimen within the measurement area based on a fitting analysis on the XRR measurement data set with an XRR response model and a fitting analysis of the XPS measurement data set with an XPS response model.

2. The metrology system of claim 1, wherein the amount of x-ray illumination radiation includes multiple illumination wavelengths.

3. The metrology system of claim 2, wherein the amount of x-ray illumination radiation includes multiple illumination wavelengths within a photon energy range from 80 electronvolts to 3,000 electronvolts.

4. The metrology system of claim 1, wherein the one or more x-ray illumination optical elements direct the amount of x-ray illumination radiation onto the specimen at a nominal grazing incidence angle between 5 and 20 degrees.

5. The metrology system of claim 1, further comprising:
   a wafer positioning system configured to selectively position the specimen within a range of at least one degree about one or more axes of rotation aligned in-plane with the surface of the specimen.

6. The metrology system of claim 1, wherein the parameter of interest is treated as a global parameter in a parallel fitting analysis including both the fitting analysis on the XRR measurement data and the fitting analysis on the XPS measurement data.

7. The metrology system of claim 1, further comprising:
   one or more electron optical elements located in an electron collection path between the specimen and the photoelectron detector.

8. The metrology system of claim 1, further comprising:
   one or more magnetic field shielding elements located at or near an electron collection path between the specimen and the photoelectron detector.

9. The metrology system of claim 1, further comprising:
   one or more electron analyzers located in an electron collection path between the specimen and the photoelectron detector, wherein the one or more electron analyzers sort the amount of electrons emitted from the specimen in response to the amount of x-ray illumination radiation according to energy.

10. The metrology system of claim 1, further comprising:
    an electron beam block located across an x-ray collection path between the specimen and the x-ray detector to prevent electrons from reaching the x-ray detector.

11. The metrology system of claim 1, wherein the XRR measurement data and the XPS measurement data are associated with measurements at a plurality of different nominal angles of incidence, different nominal azimuth angles, or both.

12. The metrology system of claim 1, wherein the computing system is further configured to:

communicate a command signal to at least one of the one or more x-ray illumination optical elements that cause the at least one of the one or more x-ray illumination optical elements to adjust any of a location of incidence, a beam shape, a beam divergence, a beam intensity, and a range of wavelengths.

13. The metrology system of claim 12, wherein the command signal is determined at least in part on the amount of radiation received by the x-ray detector.

14. The metrology system of claim 1, wherein the one or more x-ray illumination optical elements simultaneously focus the amount of x-ray illumination radiation onto the specimen as an x-ray illumination beam incident on the specimen at a plurality of different nominal angles of incidence, a plurality of different nominal wavelengths, and a plurality of azimuth angles.

15. The metrology system of claim 1, wherein a source area of the x-ray illumination source is characterized by a lateral dimension of 20 micrometers or less.

16. The metrology system of claim 1, wherein the one or more x-ray illumination optical elements focus the amount of soft x-ray radiation onto the semiconductor wafer with a magnification factor of 0.5 or less.

17. A method comprising:
generating an amount of x-ray illumination radiation;
directing the amount of x-ray illumination radiation from an x-ray illumination source to a measurement area of a specimen under measurement;
detecting an amount of radiation from the specimen on an x-ray detector in response to the amount of x-ray illumination radiation, wherein the x-ray illumination source and the x-ray detector are disposed in a X-Ray Reflectometry (XRR) measurement configuration;
generating an amount of XRR measurement data based on the received amount of radiation;
detecting an amount of electrons emitted from the specimen on a photoelectron detector in response to the amount of x-ray illumination radiation, wherein the x-ray illumination source and the photoelectron detector are disposed in a X-Ray Photoelectron Spectroscopy (XPS) measurement configuration;
generating an amount of XPS measurement data based on the received amount of electrons; and
estimating a value of a parameter of interest characterizing a structure disposed on the specimen within the measurement area based on a fitting analysis on the XRR measurement data set with an XRR response model and a fitting analysis of the XPS measurement data set with an XPS response model.

18. A metrology system comprising:
an x-ray illumination source configured to generate an amount of x-ray illumination radiation;
one or more x-ray illumination optical elements disposed in an illumination path between the x-ray illumination source and a specimen under measurement, wherein the one or more x-ray illumination optical elements direct the amount of x-ray illumination radiation from the x-ray illumination source to a measurement area of the specimen under measurement;
an x-ray detector configured to receive an amount of radiation from the specimen in response to the amount of x-ray illumination radiation, wherein the x-ray illumination source and the x-ray detector are disposed in a X-Ray Reflectometry (XRR) measurement configuration, and wherein the x-ray detector generates an amount of XRR measurement data based on the received amount of radiation; and
a photoelectron detector configured to receive an amount of electrons emitted from the specimen in response to the amount of x-ray illumination radiation, wherein the x-ray illumination source and the photoelectron detector are disposed in a X-Ray Photoelectron Spectroscopy (XPS) measurement configuration, and wherein the photoelectron detector generates an amount of XPS measurement data based on the received amount of electrons; and
a computing system configured to estimate a value of a first parameter of interest characterizing a structure disposed on the specimen within the measurement area based on a fitting analysis on the XRR measurement data set with an XRR response model, a fitting analysis of the XPS measurement data set with an XPS response model, or a combination thereof, wherein the XRR response model and the XPS response model include at least one shared model parameter, and wherein a value of the at least one shared model parameter is resolved by the fitting analysis.

19. The metrology system of claim 18, the computing system further configured to:
estimate a value of a second parameter of interest characterizing the structure based on the value of the first parameter of interest and the XRR measurement data, the XPS measurement data, or a combination thereof.

20. The metrology system of claim 18, wherein the estimating of the value of the first parameter of interest is based on the XRR measurement data, and wherein the estimating of the value of the second parameter of interest is based on the first parameter of interest and the XPS measurement data.

21. The metrology system of claim 18, wherein the estimating of the value of the first parameter of interest is based on the XPS measurement data, and wherein the estimating of the value of the second parameter of interest is based on the first parameter of interest and the XRR measurement data.

* * * * *